United States Patent [19]
Hayashi

[11] Patent Number: 5,940,715
[45] Date of Patent: Aug. 17, 1999

[54] METHOD FOR MANUFACTURING SEMICONDUCTOR DEVICE

[75] Inventor: Fumihiko Hayashi, Tokyo, Japan

[73] Assignee: NEC Corporation, Tokyo, Japan

[21] Appl. No.: 08/920,903

[22] Filed: Aug. 29, 1997

[30] Foreign Application Priority Data

Aug. 29, 1996 [JP] Japan .................................. 8-229124

[51] Int. Cl.⁶ ........................... H01L 21/76; H01L 21/31; H01L 21/469
[52] U.S. Cl. ........................ 438/407; 438/439; 438/440; 438/448; 438/766
[58] Field of Search .................................. 438/439, 407, 438/440, 448, 766

[56] References Cited

U.S. PATENT DOCUMENTS 3,874,919  4/1975  Lehman .
5,550,074  8/1996  Lin .
5,700,728  12/1997  Kuo et al. .

FOREIGN PATENT DOCUMENTS 4-196341  7/1992  Japan .

*Primary Examiner*—John F. Niebling
*Assistant Examiner*—Josetta Jones
*Attorney, Agent, or Firm*—Young & Thompson

[57] ABSTRACT

A semiconductor device manufacturing method capable of realizing a fine device isolation by stably suppressing the narrow channel effect and the reverse narrow channel effect in an N-channel MOS transistor. A patterned silicon nitride film 102 is formed, and after a P-type ion implanted layer 103 is formed, a field oxide film 105*a* is formed. In this process, re-distribution of the P-type impurity is caused by segregation, so that a P-type impurity concentration adjusting region 104*a* is formed at the surface of a P-type silicon substrate 101 in the proximity of a bird's beak of the field oxide film 105*a*.

7 Claims, 9 Drawing Sheets

Fig. 1A

103 P-ION IMPLANTED LAYER

Fig. 1B

104a P-TYPE IMPURITY CONCENTRATION ADJUSTING REGION

Fig. 1C

106 PUNCH-THROUGH STOPPER

303a P-ION IMPLANTED LAYER

Fig. 8B

303aa P-ION IMPLANTED LAYER

Fig. 8B  305a FIELD OXIDE

304a P-TYPE IMPURITY CONCENTRATION ADJUSTING REGION

Fig. 8D

306a PUNCH-THROUGH STOPPER

Fig. 8E  308a GATE ELECTRODE
307a GATE OXIDE

METHOD FOR MANUFACTURING SEMICONDUCTOR DEVICE

BACKGROUND OF THE INVENTION

1. Field of the Invention

The present invention relates to a method for manufacturing a semiconductor device, and more specifically to a device isolation forming method for minimizing a change of a threshold voltage of a MOS transistor at a device isolation region end.

2. Description of Related Art

As a forming method of a device isolation region in a semiconductor device, a selective oxidation such as a LOCOS (local oxidation of silicon) process has been widely used. In this selective oxidation, a lateral oxidation called a "bird's beak" appears remarkably. Therefore, it is necessary to suppress the bird's beak in order to form a fine device formation region. In addition, when the channel width of a MOS transistor is narrowed, it is necessary to prevent a narrow channel effect in which the absolute value of a threshold increases.

Figure 10:
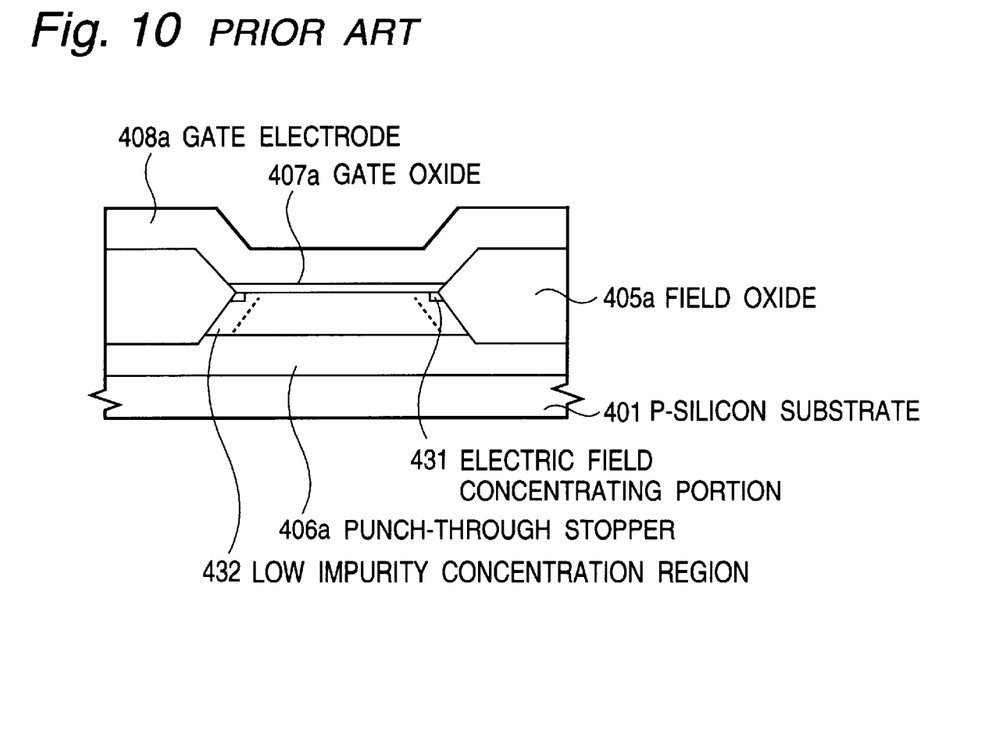
FIG. 10 is a diagrammatic sectional view of the semiconductor device in accordance with the first prior art.
Figure 11:
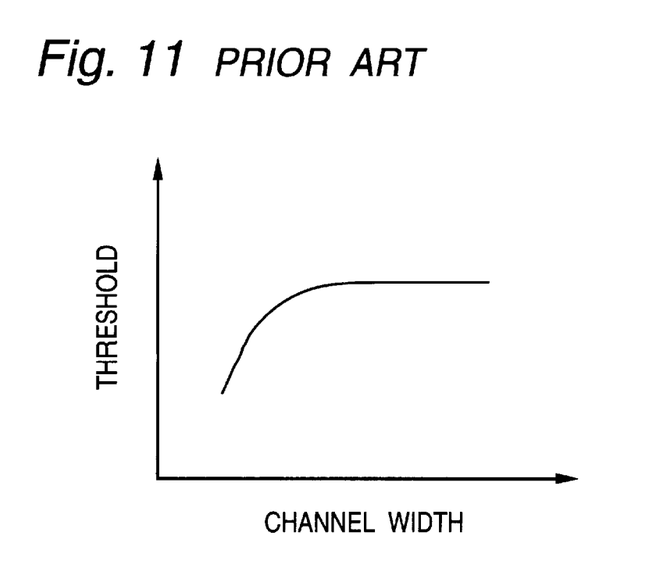
FIG. 11 is a graph showing a channel width dependency of the threshold of the N-channel MOS transistor, for illustrating the problem of the first prior art.

Referring to FIG. 10, which is a diagrammatic sectional view of a semiconductor device, a technology for preventing the narrow channel effect in an N-channel MOS transistor (called a "first prior art" hereinafter) adopts a transistor having the following structure. On a device isolation region of a surface of a P-type silicon substrate 401, a field oxide film 405a is formed by the LOCOS process. On a surface of a channel region in a device formation region of the surface of the P-type silicon substrate 401, a gate electrode 408a is formed through a gate oxide film 407a which is formed by a thermal oxidation. In the P-type silicon substrate 401, a P-type punch-through stopper layer 406a is formed. This punch-through stopper layer 406a is isolated from the gate oxide film 407a and is in contact with at least a planar portion of a bottom of the field oxide film 405a. This punch-through stopper layer 406a is formed by ion-implantation after the field oxide film 405a is formed.

In the above mentioned structure, when the field oxide film 405a is formed in the form of suppressing the bird's beak, an electric field concentrating portion 431 occurs at an end of the device isolation region (which is an edge of the field oxide film 405a), with the result that the threshold is apt to lower. In addition, since the punch-through stopper layer 406a is formed by a high energy ion implantation in such a manner that a concentration peak is formed in the proximity of the planar portion of the bottom of the field oxide film 405a, the ion-implanted impurity does not reach (or diffuse) upward sufficiently to influence the P-type impurity concentration in the neighborhood of the surface of the P-type silicon substrate 401. Furthermore, because of segregation of the P-type impurity by a heat treatment for forming the field oxide film 405a and others, a low impurity concentration region 432 is formed in the proximity of the edge of the field oxide film 405a.

Because of the above mentioned causes, in the N-channel MOS transistor there occurs a reverse narrow channel effect in which the narrower the channel width becomes, the lower the threshold becomes. If this reverse narrow channel effect appears, when the threshold of a wide channel width is properly set, in a narrow channel width a sub-threshold leak current flows because of the drop of the threshold. This is an obstruction in reducing the power consumption. In this connection, in order to prevent this problem, if the threshold is set to a high value, the on-current of the transistor lowers. This is an obstacle to speeding-up of the transistor.

On the other hand, in a P-channel MOS transistor, the reverse narrow channel effect does not occur, differently from the N-channel MOS transistor. However, because of segregation of the N-type impurity at the time of forming the field oxide film by the selective oxidation, the N-type impurity concentration becomes extremely high in the proximity of the edge of the field oxide film, with the result that a narrow channel effect becomes remarkable.

A technology for preventing the above mentioned reverse narrow channel effect in the N-channel MOS transistor (called a "second prior art" hereinafter) is disclosed by for example Japanese Patent Application Pre-examination Publication No. JP-A-04-196341. In this disclosed technology, a low impurity concentration region formed in a silicon substrate surface in the proximity of an edge of a field oxide film, is effectively compensated for by forming a P-type impurity concentration adjusting region in the silicon substrate surface in contact with the edge of the field oxide film.

Figure 12A:
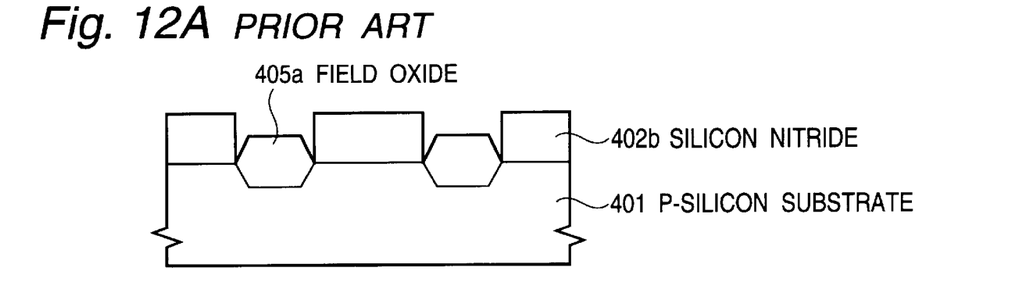
FIGS. 12A to 12D are diagrammatic sectional views illustrating the manufacturing device manufacturing process in accordance with the second prior art.

Referring to FIGS. 12A to 12D, which are diagrammatic sectional views for illustrating a manufacturing process of the semiconductor device, the semiconductor device disclosed by JP-A-04-196341 is formed as follows:

Firstly, on a surface of a P-type silicon substrate 401 having the impurity concentration of for example $1 \times 10^{17}$ cm$^{-3}$, a silicon nitride film, which is an oxidation resistive film, having a thickness of 200 nm is deposited on a low pressure chemical vapor deposition (LPCVD) process. This silicon nitride film is patterned so that a silicon nitride film 402b remains to cover a device formation region of the surface of the P-type silicon substrate 401. By using this silicon nitride film 402b as a mask, a field oxide film 405b having the thickness of 400 nm is formed on a device isolation region of the surface of the P-type silicon substrate 401, by a thermal oxidation at for example 1000° C. (selective oxidation) (FIG. 12A).

Figure 12B:
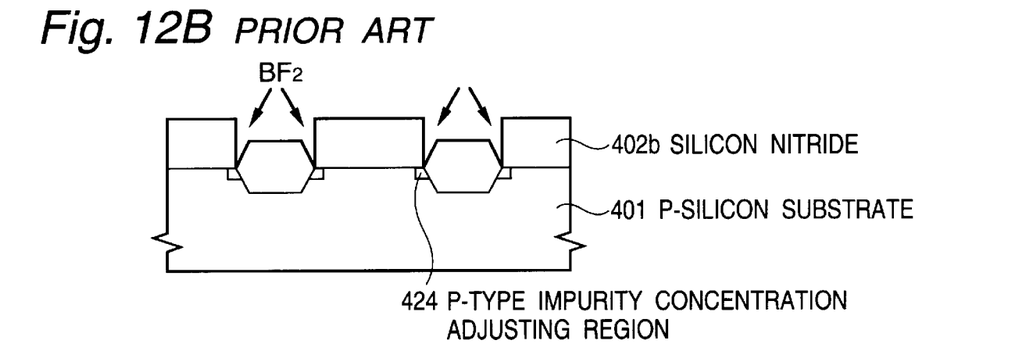

Next, a rotary oblique ion implantation of a P-type impurity such as BF$_2$ is carried out at an angle of 30 degrees to the surface of the P-type silicon substrate 401 under an acceleration voltage of 30 keV and a dose of $2 \times 10^{13}$ cm$^{-2}$, so that a P-type ion implanted layer (not shown) is formed at the surface of the P-type silicon substrate 401 in contact with the edge of the field oxide film 405b. Furthermore, a heat treatment is carried out to activate the P-type ion implanted layer, so that a P-type impurity concentration adjusting region 424 is formed at the surface of the P-type silicon substrate 401 in contact with the edge of the field oxide film 405b (FIG. 12B).

Figure 12C:
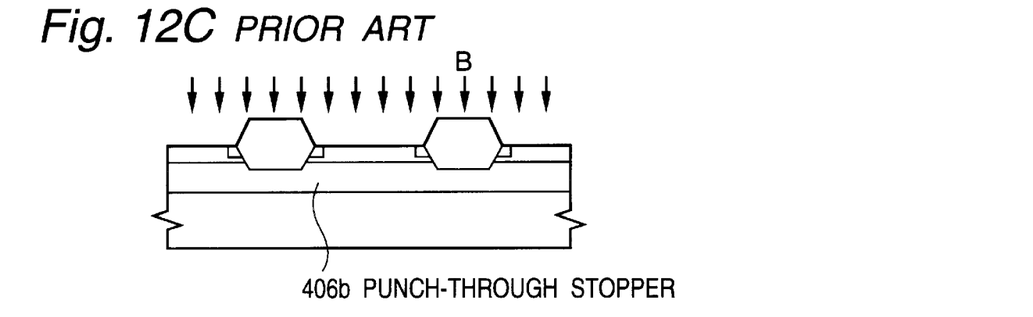

After the silicon nitride film 402b is removed, a P-type impurity such as boron (B) is ion-implanted onto the whole surface under an acceleration voltage of 150 keV and a dose of $1 \times 10^{13}$ cm$^{-2}$, so that a second P-type ion implanted layer (not shown) is formed in the P-type silicon substrate 401. The condition for this ion implantation is set to the effect that the concentration peak of the second P-type ion implanted layer is positioned near to the planar portion of the bottom of the field oxide film 405b, but will never be contacted with a bottom of source/drain regions formed of an N$^+$ diffused layer which will be formed in a later step. Furthermore, a heat treatment is carried out to activate the second P-type ion implanted layer, so that a P-type punch-through stopper layer 406b is formed in the P-type silicon substrate 401. This P-type punch-through stopper layer 406b is in contact with at least the planar portion of the bottom of the field oxide film 405b (FIG. 12C).

Figure 12D:
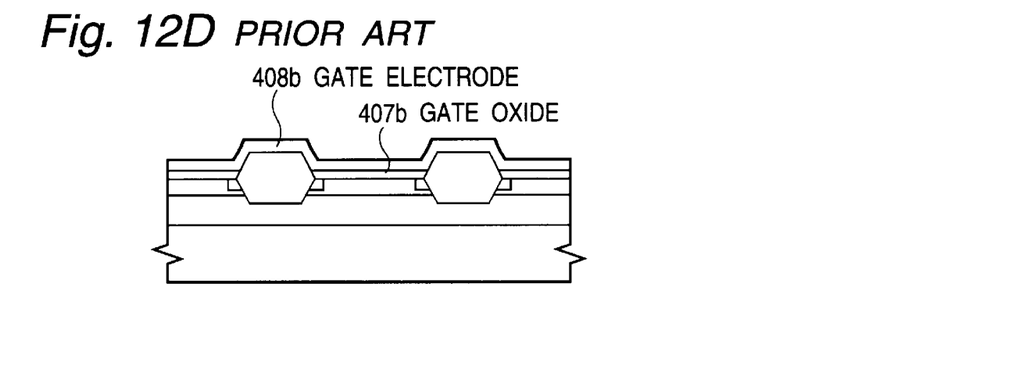

Thereafter, a gate oxide film 407b is formed on the device formation region of the surface of the P-type silicon substrate 401, and then, a gate electrode 408b and source/drain regions (not shown) formed of an N⁺ diffused layer are formed, so that an N-channel MOS transistor is formed (FIG. 12D).

The above mentioned semiconductor device manufacturing method disclosed by JP-A-04-196341 can be applied for suppressing the narrow channel effect in the P-channel MOS transistor. In this case, an N-type impurity concentration adjusting region is formed in an N-type silicon substrate surface in contact with an edge of an field oxide film, by ion-implanting a P-type impurity (not an N-type impurity) using as a mask the field oxide film and the silicon nitride film which is an oxidation resistive film, so that elevation of the N-type impurity concentration in this portion is effectively canceled.

However, the second prior art has a problem that the reverse narrow channel effect in the N-channel MOS transistor can not be suppressed with a good controllability. Now, this problem will be described with reference to FIGS. 13A and 13B, which are diagrammatic sectional views of a semiconductor device.

Figure 13A:
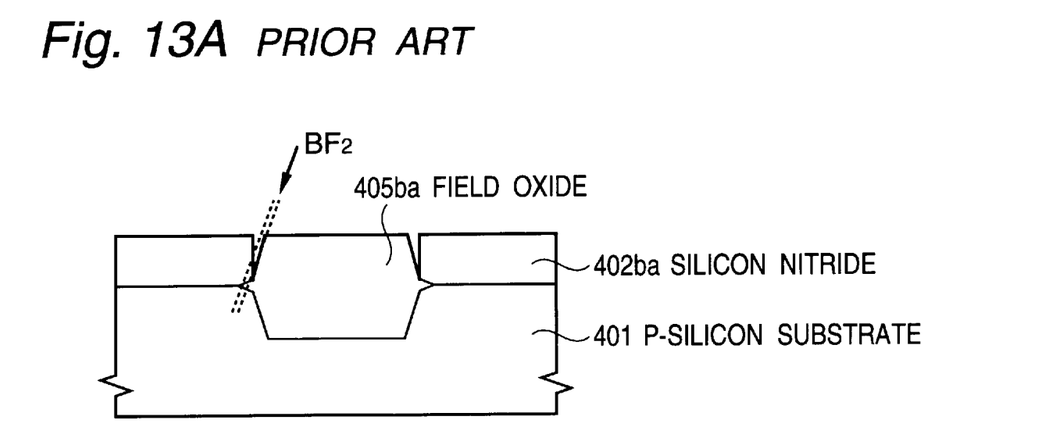
FIGS. 13A to 13B are diagrammatic sectional views for illustrating the problem of the second prior art.

Firstly, as shown in FIG. 13A, the P-type impurity concentration adjusting region in the second prior art is formed by ion-implanting to a locally thinned portion using as a mask the silicon nitride film 402ba and the field oxide film 405ba after the field oxide film 405ba is formed. Here, the field oxide film 405ba after the selective oxidation is in the shape that the field oxide film 405ba considerably projects above the P-type silicon substrate 401 at an end of the device formation region in contact with the silicon nitride film 402ba. As a result, the P-type impurity such as BF$_2$ is ion-implanted into only the surface of the P-type silicon substrate 401 which is not covered by the silicon nitride film 402ba in the neighborhood of the end of the device isolation region. Therefore, an effectively used region is limited to a very narrow region as shown by a dotted line in the drawing. Accordingly, when the film thickness and the shape of the field oxide film 405ba and the implanting angle of the ion implantation vary, it is in some cases that no P-type impurity concentration adjusting region can be formed. In other words, the second prior art has difficulty controlling suppression of reverse narrow channel effect.

Figure 13B:
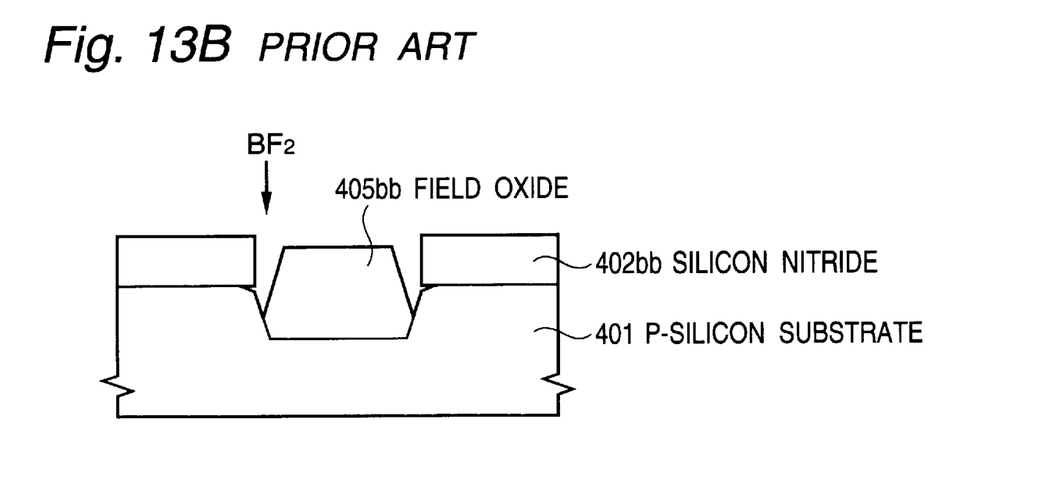

JP-A-04-196341 disclosing the above mentioned second prior art also discloses another method for forming the P-type impurity concentration adjusting region. Referring to FIG. 13B, this method is as follows: First, the thickness of the original field oxide film formed by the selective oxidation is thinned (retarded) by an etching, so that a field oxide film 405bb is formed. Thereafter, by using the thinned field oxide film 405bb and the silicon nitride film 402bb as a mask, the P-type impurity such as BF$_2$ is ion-implanted to the surface of the P-type silicon substrate 401 at an exposed end of the device isolation region, so that the P-type impurity concentration adjusting region is formed in the surface of the P-type silicon substrate 401 at an exposed end of the device isolation region. In this case, the P-type silicon substrate 401 has a shape gouged at the end of the device isolation region, so that a junction depth becomes deep in an end of an N⁺ diffused layer which will be formed in a later step for forming the source/drain regions of the N-channel MOS transistor. As a result, the punch-through resistive property between two N⁺ diffused layers included in the same MOS transistor is deteriorated, and therefore, it becomes difficult to form a fine device isolation region.

Furthermore, the second prior art also has a problem that the narrow channel effect in the P-channel MOS transistor can not be suppressed with a good controllability. In the case for forming the P-channel MOS transistor, since the N-type impurity concentration adjusting region is formed by the ion implantation of the P-type impurity, there occurs an inconvenience similar to the N-channel MOS transistor.

SUMMARY OF THE INVENTION

Accordingly, it is an object of the present invention to provide a semiconductor device manufacturing method which has overcome the above mentioned problems of the prior art.

Another object of the present invention is to provide a semiconductor device manufacturing method capable of realizing a fine device isolation in a MOS transistor, by stably suppressing the narrow channel effect and the reverse narrow channel effect in the N-channel MOS transistor and the narrow channel effect in the P-channel MOS transistor.

A semiconductor device manufacturing method in accordance with a first aspect of the present invention comprises the step of forming at least an oxidation resistive film on a surface of a silicon substrate of one conductivity type, forming a photo resist film pattern on the oxidation resistive film in a device formation region of the surface of the silicon substrate, and patterning at least the oxidation resistive film using the photo resist film pattern as a mask; the step of ion-implanting a P-type impurity under a predetermined condition, using the photo resist film pattern as a mask, to form a P-type ion-implanted layer at the surface of the silicon substrate; the step of removing the photo resist film pattern; the step of forming a field oxide film at the surface of the silicon substrate by a selective oxidation using the oxidation resistive film as a mask, and forming a one conductivity type impurity concentration adjusting region at an end of the device formation region adjacent to the field oxide film; and the step of removing the oxidation resistive film, and ion-implanting an impurity of the one conductivity type under a predetermined condition, to form in the silicon substrate a punch-through stopper layer of the one conductivity type in contact with at least a planar portion of a bottom of the field oxide film. Preferably, after the photo resist film is removed, the P-type ion-implanted layer is activated by a heat treatment. In addition, the ion implantation of the P-type impurity is carried out by a rotary oblique ion implantation.

A semiconductor device manufacturing method in accordance with a first aspect of the present invention comprises the step of forming at least an oxidation resistive film on a surface of a silicon substrate of one conductivity type, forming a photo resist film pattern on the oxidation resistive film in a device formation region of the surface of the silicon substrate, patterning at least the oxidation resistive film using the photo resist film pattern as a mask, and forming a groove at the surface of the silicon substrate using the photo resist film pattern as a mask; the step of carrying out a rotary oblique ion implantation of a P-type impurity under a predetermined condition, using at least the photo resist film pattern as a mask, to form a P-type ion-implanted layer at a surface of the groove; the step of removing the photo resist film pattern; the step of forming a field oxide film at the surface of the silicon substrate by a selective oxidation using the oxidation resistive film as a mask, and forming a one conductivity type impurity concentration adjusting region at an end of the device formation region adjacent to the field oxide film; and the step of removing the oxidation resistive film, and ion-implanting an impurity of the one conductivity type under a predetermined condition, to form in the silicon substrate a punch-through stopper layer of the one conductivity type in contact with at least a planar portion of a bottom of the field oxide film. Preferably, after the photo resist film is removed, the P-type ion-implanted layer is activated by a heat treatment.

A semiconductor device manufacturing method in accordance with a third aspect of the present invention comprises the step of forming at least an oxidation resistive film on a surface of a silicon substrate of one conductivity type, forming a photo resist film pattern on the oxidation resistive film in a device formation region of the surface of the silicon substrate, and patterning at least the oxidation resistive film using the photo resist film pattern as a mask; the step of carrying out a rotary oblique ion implantation of a P-type impurity under a predetermined condition, using at least the photo resist film pattern as a mask, to form a P-type ion-implanted layer at the surface of the silicon substrate; the step of forming at the surface of the silicon substrate a groove having a predetermined depth penetrating through the one conductivity type ion-implanted layer, by an etching using at least the photo resist film pattern as a mask; the step of removing the photo resist film pattern; the step of forming a field oxide film at the surface of the silicon substrate by a selective oxidation using the oxidation resistive film as a mask, and forming a one conductivity type impurity concentration adjusting region at an end of the device formation region adjacent to the field oxide film; and the step of removing the oxidation resistive film, and ion-implanting an impurity of the one conductivity type under a predetermined condition, to form in the silicon substrate a punch-through stopper layer of the one conductivity type in contact with at least a planar portion of a bottom of the field oxide film.

The above and other objects, features and advantages of the present invention will be apparent from the following description of preferred embodiments of the invention with reference to the accompanying drawings.

BRIEF DESCRIPTION OF THE DRAWINGS

Pigs. 7A to 7E are diagrammatic sectional views illustrating one embodiment of the manufacturing process in accordance with the second aspect of the present invention;

FIGS. 8A to 8E are diagrammatic sectional views illustrating a first embodiment of the manufacturing process in accordance with the third aspect of the present invention;

FIGS. 9A to 9E are diagrammatic sectional views illustrating a second embodiment of the manufacturing process in accordance with the third aspect of the present invention;

DESCRIPTION OF THE PREFERRED EMBODIMENTS

Now, embodiments of the semiconductor memory device in accordance with the present invention will be described with reference to the accompanying drawings.

Referring to FIGS. 1A to 1D which are diagrammatic sectional views illustrating the manufacturing process in accordance with the present invention, there will be described a first embodiment in which the first aspect of the present invention is applied to manufacturing of an N-channel MOS transistor.

Figure 1A:
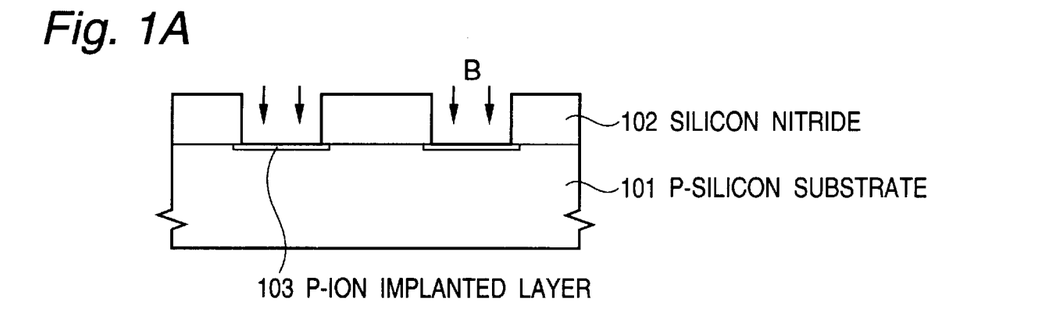
FIGS. 1A to 1D are diagrammatic sectional views illustrating a first embodiment of the manufacturing process in accordance with the first aspect of the present invention.

On a surface of a P-type silicon substrate 101 having the impurity concentration of for example $1 \times 10^{17}$ cm$^{-3}$ to $1 \times 10^{18}$ cm$^{-3}$, a silicon nitride film, which is an oxidation resistive film, having a thickness of 50 nm to 300 nm is deposited on a low pressure chemical vapor deposition (LPCVD) process. Prior to deposition of this silicon nitride film, a silicon oxide film having a thickness of 5 nm to 30 nm (pad oxide film) may be deposited on the surface of the P-type silicon substrate 101 by thermal oxidation. This silicon nitride film is patterned using a photo resist film pattern (not shown) as a mask, so that a silicon nitride film 102 remains to cover a device formation region of the surface of the P-type silicon substrate 101. By using at least this silicon nitride film 102 as a mask, a P-type impurity of boron (B) (or BF$_2$) is ion-implanted to the principal surface of the P-type silicon substrate 101, perpendicular to the principal surface of the P-type silicon substrate 101, so that a P-type ion-implanted layer 103 is formed The condition for this ion implantation is determined to the effect that the impurity concentration of P-type ion-implanted layer 103 is on the order of $1 \times 10^{18}$ cm$^{-3}$ to $1 \times 10^{19}$ cm$^{-3}$ and the implantation depth is near to the surface of the P-type silicon substrate 101, which is shallower than a planar bottom of a field oxide film which will be formed in a later step (FIG. 1A)

Figure 1B:
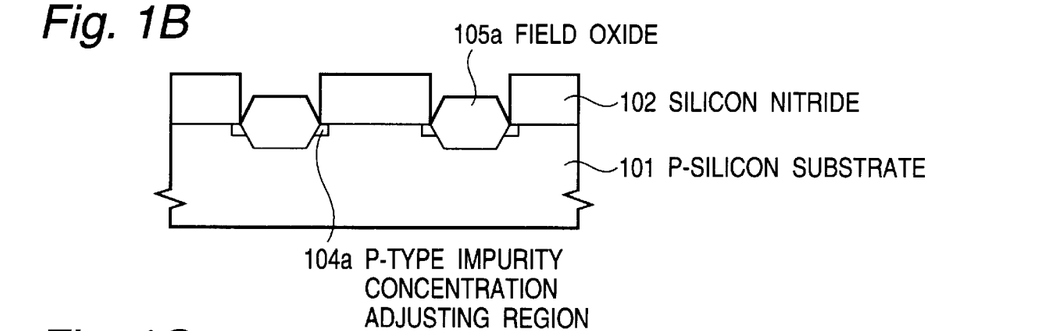

Thereafter, after the photo resist pattern (not shown) is removed, a thermal oxidation (selective oxidation) is carried out at a temperature of 950° C. to 1100° C., so that a field oxide film 105a having the thickness of 100 nm to 500 nm is formed on a device isolation region of the surface of the P-type silicon substrate 101, and simultaneously, the P-type ion-implanted layer 103 is activated to form a P-type impurity concentration adjusting region 104a which is positioned at the surface of the P-type silicon substrate 101 adjacent to the edge of the field oxide film 105a, and which has the impurity concentration of $1 \times 10^{17}$ cm$^{-3}$ to $1 \times 10^{18}$ cm$^{-3}$. The impurity concentration of the P-type impurity concentration adjusting region 104a lowers to about 1/10 of the impurity concentration of P-type ion-implanted layer 103 because of segregation caused in the thermal oxidation for forming the field oxide film 105a (FIG. 1B).

Figure 1C:
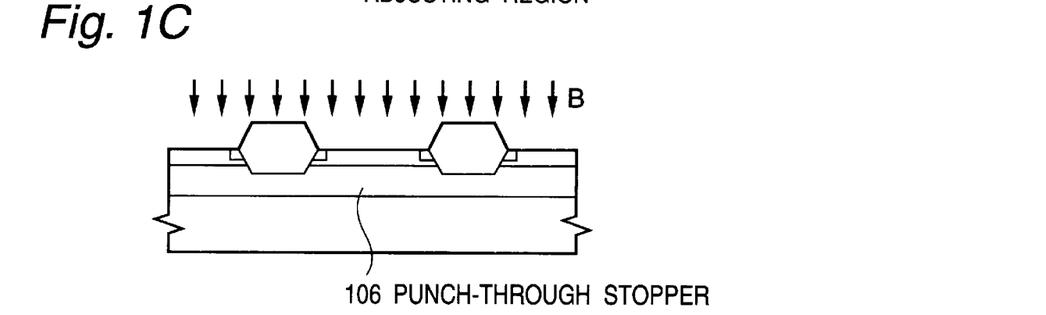

After the silicon nitride film 102a is removed, a P-type impurity such as boron (B) is ion-implanted onto the whole surface to form a second P-type ion implanted layer (not shown) in the P-type silicon substrate 101. The condition for this ion implantation is set to the effect that the concentration peak of the second P-type ion-implanted layer is positioned near to a planar portion of the bottom of the field oxide film 105a. Furthermore, a heat treatment is carried out to activate the second P-type ion implanted layer, so that a P-type punch-through stopper layer 106 having the impurity concentration of $1\times10^{18}$ cm$^{-3}$ to $1\times10^{19}$ cm$^{-3}$ is formed in the P-type silicon substrate 101. This P-type punch-through stopper layer 106 is positioned at a level deeper than with a bottom of source/drain regions formed of an N$^+$ diffused layer which will be formed in a later step, but is in contact with at least the planar portion of the bottom of the field oxide film 105a (FIG. 1C).

Figure 1D:
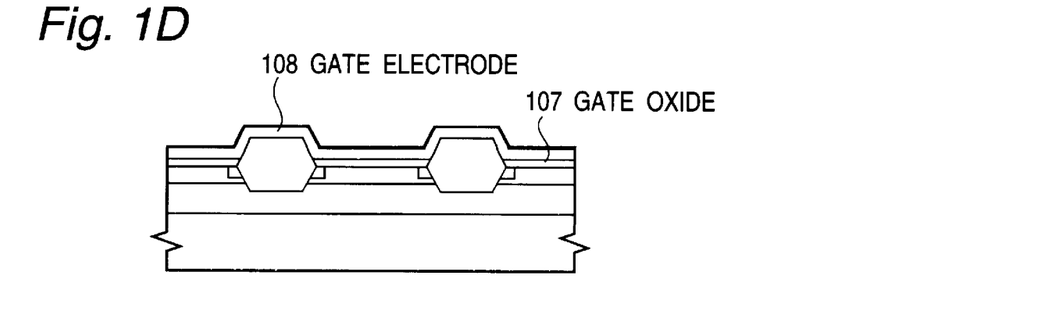

Thereafter, a gate oxide film 107 is formed on the device formation region of the surface of the P-type silicon substrate 101 by the thermal oxidation, and then, a gate electrode 108 and source/drain regions (not shown) formed of an N$^+$ diffused layer are formed, so that an N-channel MOS transistor in accordance with the first embodiment is formed (FIG. 1D).

Figure 2A:
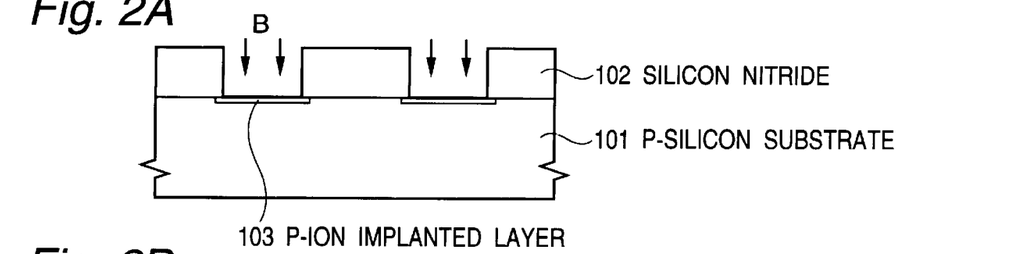
FIGS. 2A to 2C are diagrammatic sectional views illustrating a second embodiment of the manufacturing process in accordance with the first aspect of the present invention.
Figure 2B:
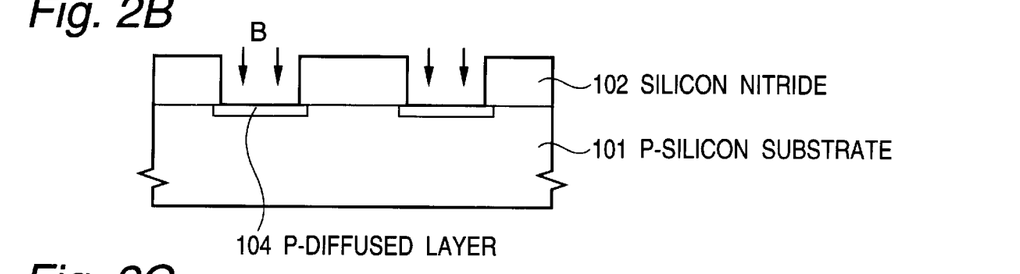
Figure 2C:
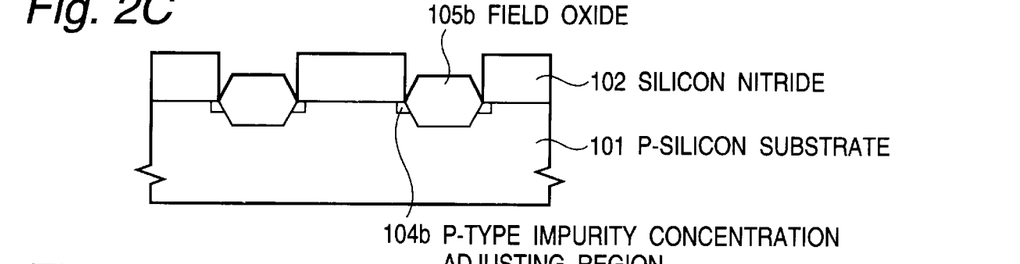

Referring to FIGS. 2A to 2C which are diagrammatic sectional views illustrating the manufacturing process in accordance with the present invention, there will be described a second embodiment in which the first aspect of the present invention is applied to manufacturing of an N-channel MOS transistor.

Similarly to the above mentioned first embodiment of the first aspect of the present invention, on a surface of a P-type silicon substrate 101 having the impurity concentration of for example $1\times10^{17}$ cm$^{-3}$ to $1\times10^{18}$ cm$^{-3}$, a silicon nitride film, which is an oxidation resistive film, having a thickness of 50 nm to 300 nm is deposited, and then, is patterned by an etching using a photo resist film pattern (not shown) as a mask, so that a patterned silicon nitride film 102 is formed on the surface of the P-type silicon substrate 101. Prior to deposition of this silicon nitride film, a pad oxide film having a thickness of 5 nm to 30 nm may be deposited on the surface of the P-type silicon substrate 101. By using at least this silicon nitride film 102 as a mask, a P-type impurity of for example boron is ion-implanted to the principal surface of the P-type silicon substrate 101, perpendicular to the principal surface of the P-type silicon substrate 101, so that a P-type ion-implanted layer 103 having the impurity concentration of $1\times10^{18}$ cm$^{-3}$ to $1\times10^{19}$ cm$^{-3}$ is formed (FIG. 2A).

Thereafter, the photo resist pattern (not shown) is removed, and a heat treatment is carried out at a temperature of 850° C. to 900° C., to activate the P-type ion-implanted layer 103 so as to form a P-type diffused region 114. In this heat treatment, since a thermal diffusion of the P-type impurity occurs, the P-type diffused region 114 extends in a lateral direction and a depth direction to some degree in comparison with the P-type ion-implanted layer 103 (FIG. 2B).

Succeedingly, similarly to the first embodiment of the first aspect of the present invention, a thermal oxidation (selective oxidation) is carried out at a temperature of 950° C. to 1100° C., so that a field oxide film 105a having the thickness of 100 nm to 500 nm is formed on a device isolation region of the surface of the P-type silicon substrate 101. In this selective oxidation, concurrently with the formation of the field oxide film 105b, the diffusion of the P-type impurity occurs again in the P-type diffused region 114. Therefore, the P-type diffused region 114 remains as a P-type impurity concentration adjusting region 104b having the impurity concentration of $1\times10^{17}$ cm$^{-3}$ to $1\times10^{18}$ cm$^{-3}$, only at the surface of the P-type silicon substrate 101 adjacent to the edge of the field oxide film 105b (FIG. 2C).

Thereafter, similarly to the first embodiment of the first aspect of the present invention, a P-type punch-through stopper layer, a gate oxide film, a gate electrode, and source/drain regions (not shown) an N$^+$ diffused layer are formed.

In the first and second embodiments of the first aspect of the present invention, ions are implanted to the principal surface of the P-type silicon substrate 101, perpendicular to the principal surface of the P-type silicon substrate 101, for forming the P-type ion-implanted layer 103. However, the ion-implantation is in no way limited to this manner in the first aspect of the present invention.

Figure 3A:
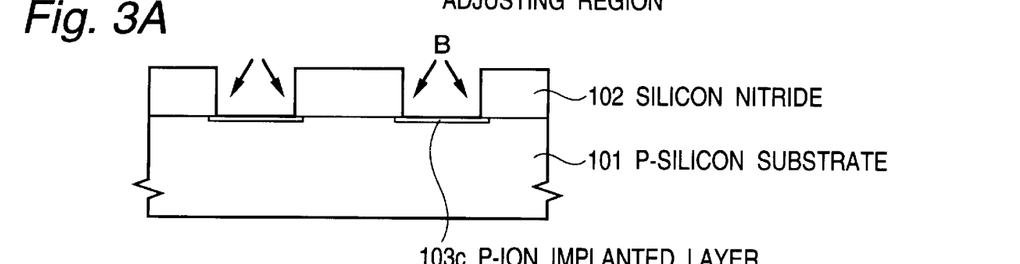
FIGS. 3A to 3B are diagrammatic sectional views illustrating a third embodiment of the manufacturing process in accordance with the first aspect of the present invention.
Figure 3B:
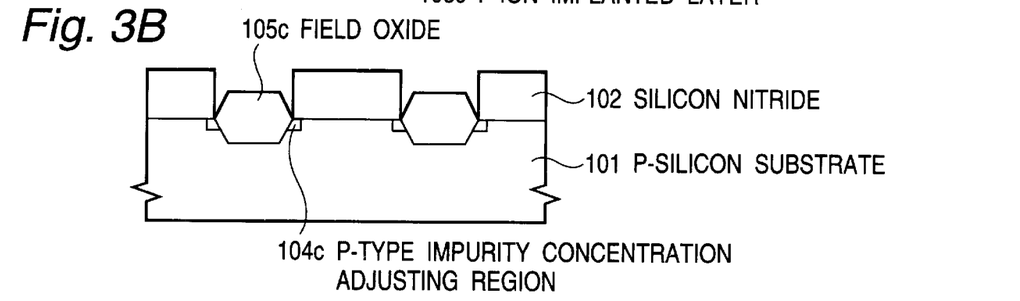

Referring to FIGS. 3A to 3B which are diagrammatic sectional views illustrating the manufacturing process in accordance with the present invention, there will be described a third embodiment in which the first aspect of the present invention is applied to manufacturing of an N-channel MOS transistor.

Firstly, similarly to the first embodiment of the first aspect of the present invention, on a surface of a P-type silicon substrate 101 having the impurity concentration of for example $1\times10^{17}$ cm$^{-3}$ to $1\times10^{18}$ cm$^{-3}$, a silicon nitride film having a thickness of 50 nm to 300 nm is deposited, and then, is patterned by an etching using a photo resist film pattern as a mask, so that a patterned silicon nitride film 102 is formed on the surface of the P-type silicon substrate 101. Prior to deposition of this silicon nitride film, a pad oxide film having a thickness of 5 nm to 30 nm (pad oxide film) may be deposited on the surface of the P-type silicon substrate 101 by thermal oxidation. Furthermore, by using at least this silicon nitride film 102 as a mask, a rotary oblique ion implantation of a P-type impurity such as boron is carried out at a desired angle to the principal surface of the P-type silicon substrate 401, so that a P-type ion-implanted layer 103c having the impurity concentration of $1\times10^{18}$ cm$^{-3}$ to $1\times10^{19}$ cm$^{-3}$ is formed (FIG. 3A).

Succeedingly to the rotary oblique ion implantation, the photo resist pattern is removed. Thereafter, similarly to the first embodiment of the first aspect of the present invention, a selective oxidation is carried out at a temperature of 950° C. to 1100° C., so that a field oxide film 105c having the thickness of 100 nm to 500 nm is formed on a device isolation region of the surface of the P-type silicon substrate 101, and simultaneously, the P-type ion-implanted layer 103c is activated to form a P-type impurity concentration adjusting region 104c which is positioned at the surface of the P-type silicon substrate 101 adjacent to the edge of the field oxide film 105c, and which has the impurity concentration of $1\times10^{17}$ cm$^{-3}$ to $1\times10^{18}$ cm$^{-3}$. The impurity concentration of the P-type impurity concentration adjusting region 104c lowers to about 1/10 of the impurity concentration of the P-type ion-implanted layer 103c because of segregation caused in the thermal oxidation for forming the field oxide film 105c (FIG. 3B).

Now, the advantage of the above mentioned first to third embodiments will be diagrammatically explained with reference to FIG. 4 which is a graph showing a profile of the impurity concentration along the P-type silicon substrate surface, FIG. 5 which is a graph showing a channel width dependency of the threshold of the N-channel MOS transistor, and FIG. 6 which is a graph showing, by comparison, a channel width dependency of the threshold of the N-channel MOS transistor.

The formation of the P-type ion-implanted layer in the process in accordance with the first aspect of the present invention for manufacturing the N-channel MOS transistor is carried out before the formation of the field oxide film, differently from the second prior art mentioned hereinbefore. As a result, there does not occur the inconvenience in the controllability in forming the P-type ion-implanted layer, depending upon the shape of the field oxide film as in the second prior art. In addition, if the ion implantation condition for forming the P-type ion-implanted layer is determined by considering the selective oxidation condition for forming the field oxide film and the set film thickness of the field oxide film, the P-type impurity concentration adjusting region in the first aspect of the present invention, which is formed of the P-type ion-implanted layer subjected to the heat treatment for the selective oxidation, is easy to have a desired impurity concentration distribution.

Figure 4:
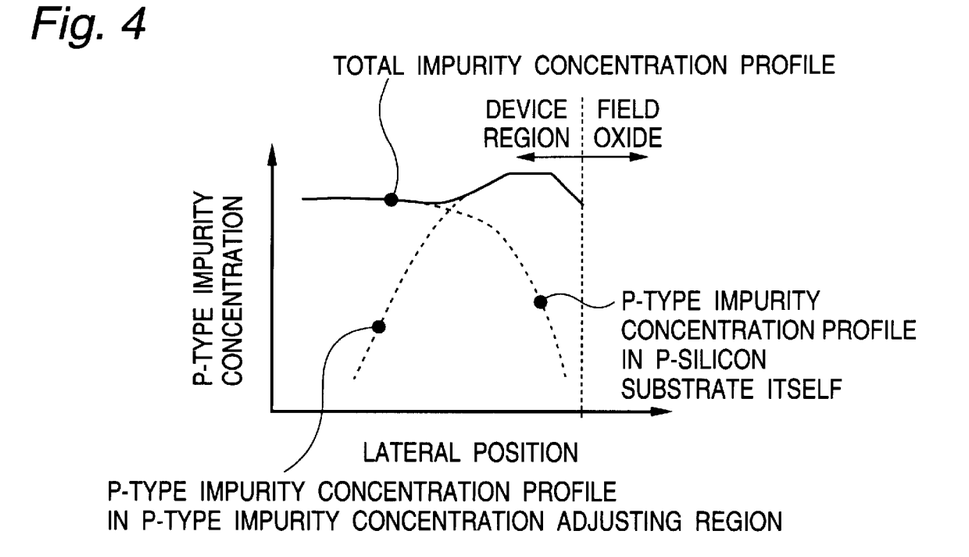
FIG. 4 is a graph showing a profile of the impurity concentration along the P-type silicon substrate surface, for illustrating the advantage of the first to third embodiments of the manufacturing process in accordance with the first aspect of the present invention.
Figure 5:
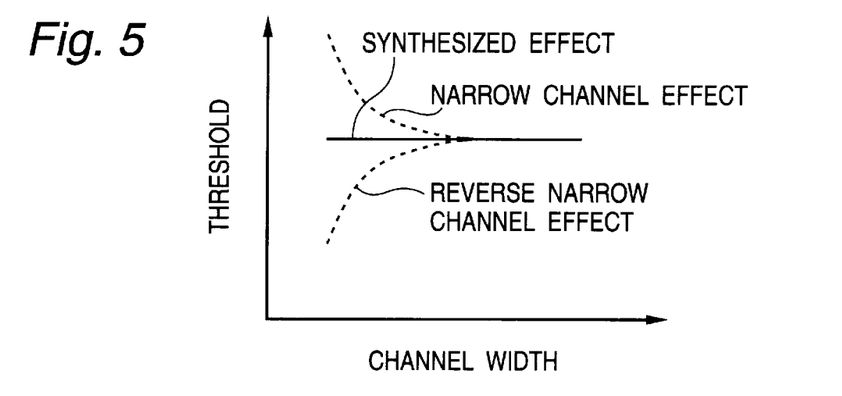
FIG. 5 is a graph showing a channel width dependency of the threshold of the N-channel MOS transistor, for illustrating the advantage of the first to third embodiments of the manufacturing process in accordance with the first aspect of the present invention.

In the N-channel MOS transistor in the first aspect of the present invention, as shown in FIG. 4, the impurity concentration at an edge zone of the device formation region of the surface of the P-type silicon substrate, is a superposition of the P-type impurity concentration profile of the P-type silicon substrate itself which has a lower impurity concentration because of segregation caused in the selective oxidation for forming the field oxide film, and the P-type impurity concentration profile of the P-type impurity concentration adjusting region formed by expanding the P-type impurity concentration profile of the P-type ion-implanted layer by the heat treatment including the selective oxidation. Therefore, if the ion implantation condition for forming the P-type ion-implanted layer is determined by considering the selective oxidation condition for forming the field oxide film and the set film thickness of the field oxide film, it becomes possible to compensate the drop of the P-type impurity concentration of the P-type silicon substrate itself at the edge of the device-formation-region of the surface of the P-type silicon substrate, by the P-type impurity concentration profile of the P-type impurity concentration adjusting region, The above mentioned phenomenon will be described from the viewpoint of the channel width dependency of the threshold. As shown in FIG. 5, if there does not exist the P-type impurity concentration adjusting region, only the reverse narrow channel effect appears. However, if there exists the P-type impurity concentration adjusting region meeting with the above mentioned condition, and if it is assumed that there does not occur the drop of the impurity concentration at the edge of the device-formation-region of the surface of the P-type silicon substrate in the process of the selective oxidation for forming the field oxide film, only the narrow channel effect appears. Therefore, with the synthesized effect of these effects, the channel width dependency of the threshold becomes substantially disappeared.

Figure 6:
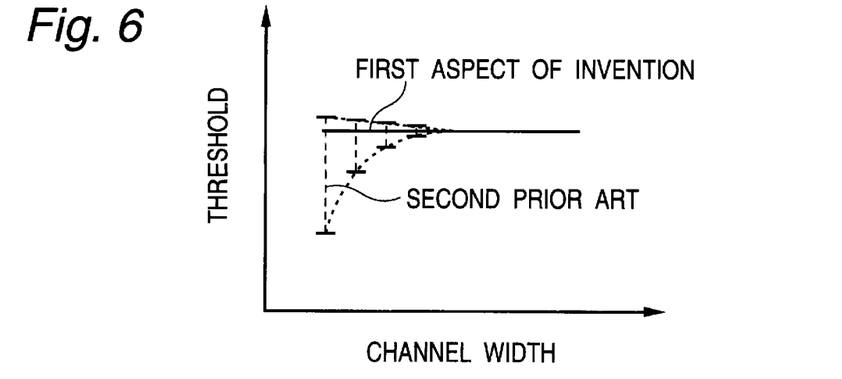
FIG. 6 is a graph showing, by comparison, a channel width dependency of the threshold of the N-channel MOS transistor, for illustrating the advantage of the first to third embodiments of the manufacturing process in accordance with the first aspect of the present invention.

From the above mentioned principle, when the first aspect of the present invention is applied to the N-channel MOS transistor, the threshold does not substantially have the channel width dependency, as shown in FIG. 6. In the second prior art, on the other hand, because of poor controllability of the formation of the P-type ion-implanted layer, it is difficult to stably control the reverse narrow channel effect in the N-channel MOS transistor, with the result that the channel width dependency of the threshold is apt to shift to the reverse narrow channel effect side.

The first to third embodiments of the first aspect of the present invention are different from the prior art process in which after the field oxide film is formed, the field oxide film is thinned and then the P-type ion-implanted layer is formed. Therefore, it is possible to avoid increasing the junction depth of the source/drain regions constituted of the $N^+$ diffused layer formed after the formation of the P-type ion-implanted layer. Accordingly, the first to third embodiments of the first aspect of the present invention can form a fine device isolation region with no deterioration of the punch-through resistive property.

The N-channel MOS transistors in the first to third embodiments of the first aspect of the present invention are formed at the surface of the P-type silicon substrate, but the first aspect of the present invention is in no way limited to the shown embodiments, and can be applied to the case in which an N-channel MOS transistor is formed in a P-well.

All the first to third embodiments of the first aspect of the present invention are directed to the method for forming the N-channel MOS transistor, but the first aspect of the present invention is in no way limited to the shown embodiments, and can be applied to a method for manufacturing a P-channel MOS transistor. For example, when the P-channel MOS transistor is formed at the surface of an N-type silicon substrate, if a field oxidation is carried out, the N-type impurity concentration increases at the N-type silicon substrate surface adjacent to an edge of the device isolation region because of segregation of the N-type impurity. Therefore, in the P-channel MOS transistor, no reverse narrow channel effect occurs, but the narrow channel effect becomes more remarkable than the N-channel MOS transistor. Therefore, if the P-type ion-implanted layer is formed before the formation of the field oxide film, the substantial increase of the N-type impurity concentration at the time of forming the field oxide film, is relaxed by the P-type impurity included in the P-type ion-implanted layer, with the result that the narrow channel effect can effectively and stably be suppressed.

Referring to FIGS. 7A to 7E which are diagrammatic sectional views illustrating the manufacturing process in accordance with the present invention, there will be described one embodiment in which the second aspect of the present invention is applied to manufacturing of an N-channel MOS transistor.

Figure 7A:
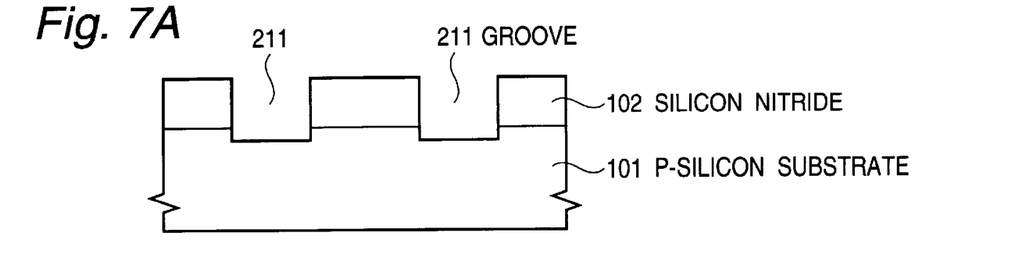

First, similar to the first embodiment of the first aspect of the present invention, on a surface of a P-type silicon substrate 201 having the impurity concentration of for example $1 \times 10^{17}$ cm$^{-3}$ to $1 \times 10^{18}$ cm$^{-3}$, a silicon nitride film, which is an oxidation resistive film, having a thickness of 50 nm to 300 nm is deposited with a LPCVD process. Prior to deposition of this silicon nitride film, a pad oxide film may be deposited on the surface of the P-type silicon substrate 201 by thermal oxidation. This silicon nitride film is patterned using a photo resist film pattern (not shown) as a mask, so that a silicon nitride film 202 remains to cover a device formation region of the surface of the P-type silicon substrate 201. Succeedingly, an anisotropic etching is carried out using the photo resist film pattern as a mask, so that a groove 211 having the depth of about 10 nm to 100 nm is formed at the surface of the P-type silicon substrate 201 (FIG. 7A).

Figure 7B:
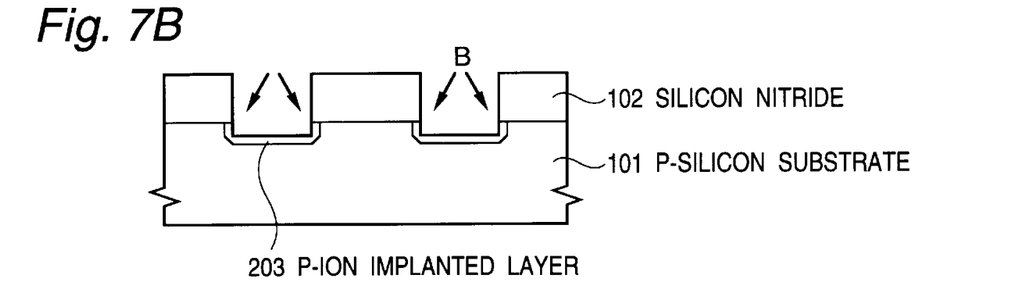

Thereafter, by using at least this silicon nitride film 202 as a mask, similar to the third embodiment of the first aspect of the present invention, a rotary oblique ion implantation of a P-type impurity such as boron is carried to form a P-type ion-implanted layer 203 having the impurity concentration of $1 \times 10^{18}$ cm$^{-3}$ to $1 \times 10^{19}$ cm$^{-3}$ at an inner surface of the groove 211 (FIG. 7B). Here, it is not preferable to implant ions perpendicular to the principal surface of the P-type silicon substrate 201, because a P-type ion-implanted layer formed at a side surface of the groove 211 has only a low impurity concentration even if the P-type ion-implanted layer formed at a bottom surface of the groove 211 has a sufficient impurity concentration. This cannot achieve the object of the present invention.

Figure 7C:
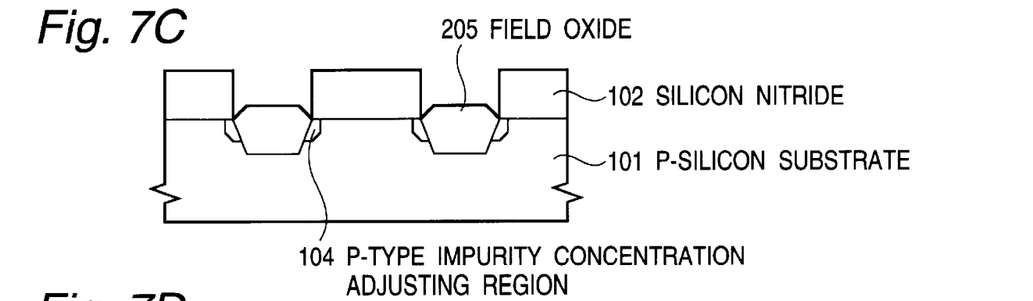

After the rotary oblique ion implantation, the photo resist pattern is removed. Then, similar to the first embodiment of the first aspect of the present invention, a selective oxidation is carried out at a temperature of 950° C. to 1100° C., so that a field oxide film 205 having the thickness of 100 nm to 500 nm is formed in the groove 211, and simultaneously, the P-type ion-implanted layer 203 is activated to form a P-type impurity concentration adjusting region 204 which is positioned at the surface of the P-type silicon substrate 201 adjacent to the edge of the field oxide film 205, and which has the impurity concentration of $1 \times 10^{17}$ cm$^{-3}$ to $1 \times 10^{18}$ cm$^{-3}$. The impurity concentration of the P-type impurity concentration adjusting region 204 lowers to about ⅒ of the impurity concentration of the P-type ion-implanted layer 203 because of segregation caused in the thermal oxidation for forming the field oxide film 205 (FIG. 7C).

Figure 7D:
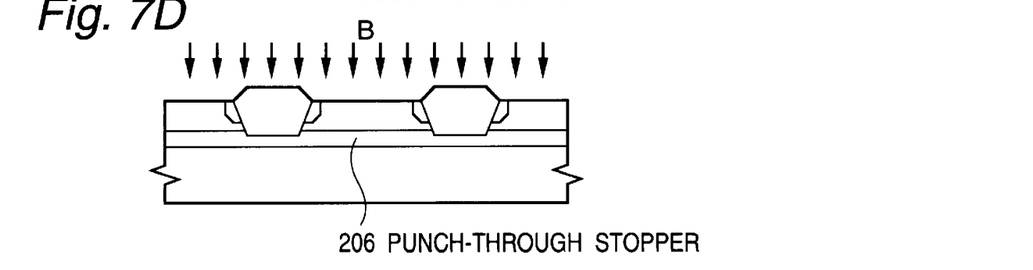

After the silicon nitride film 202 is removed, similar to the first embodiment of the first aspect of the present invention, a P-type impurity such as boron (B) is ion-implanted onto the whole surface to form a second P-type ion implanted layer (not shown) in the P-type silicon substrate 201. The condition for this ion implantation is set to the effect that the concentration peak of the second P-type ion-implanted layer is positioned near to a planar portion of the bottom of the field oxide film 205. Furthermore, a heat treatment is carried out to activate the second P-type ion implanted layer, so that a P-type punch-through stopper layer 206 having the impurity concentration of $1 \times 10^{18}$ cm$^{-3}$ to $1 \times 10^{19}$ cm$^{-3}$ is formed in the P-type silicon substrate 201. This P-type punch-through stopper layer 206 is positioned at a level deeper than a bottom of source/drain regions formed of an N$^+$ diffused layer which will be formed in a later step, but is in contact with at least the planar portion of the bottom of the field oxide film 205 (FIG. 7D).

Figure 7E:
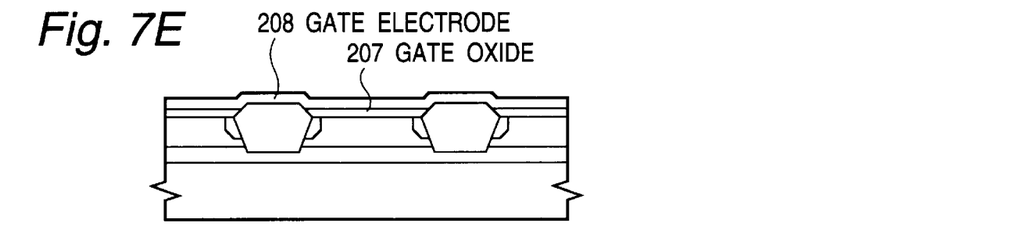

Thereafter, a gate oxide film 207 is formed on the device formation region of the surface of the P-type silicon substrate 201 by the thermal oxidation, and then, a gate electrode 208 and source/drain regions (not shown) constituted of an N$^+$ diffused layer are formed, so that an N-channel MOS transistor in accordance with this embodiment is formed (FIG. 7E).

The above mentioned embodiment of the second aspect of the present invention has the same advantage as that of the first to third embodiments of the first aspect of the present invention. Furthermore, in the embodiment of the second aspect of the present invention, since the surface step difference after the formation of the field oxide film is smaller than the first to third embodiments of the first aspect of the present invention, a photolithographic process after the formation of the field oxide film advantageously becomes easy in comparison with the first to third embodiments of the first aspect of the present invention.

The N-channel MOS transistor in the above mentioned embodiment of the second aspect of the present invention is formed at the surface of the P-type silicon substrate, but the second aspect of the present invention is in no way limited to this embodiment, and can be applied to the case in which an N-channel MOS transistor is formed in a P-well. In addition, similarly to the above mentioned second embodiment of the first aspect of the present invention, the above mentioned embodiment of the second aspect of the present invention can be modified to the effect that the P-type ion-implanted layer is converted into the P-type diffused layer by a heat treatment carried out after the formation of the P-type ion-implanted layer but before the formation of the field oxide film.

Furthermore, the above mentioned embodiment of the second aspect of the present invention is directed to the method for forming the N-channel MOS transistor, but the second aspect of the present invention is in no way limited to the shown embodiment, and can be applied to a method for manufacturing a P-channel MOS transistor. For example, when the P-channel MOS transistor is formed at the surface of an N-type silicon substrate, a groove is formed in the device isolation region of the N-type silicon substrate surface, and a P-type ion implanted layer is formed in an internal surface of the groove, and then, a field oxidation is carried out, with the result that the narrow channel effect in the P-channel MOS transistor can effectively and stably be suppressed.

Referring to FIGS. 8A to 8E which are diagrammatic sectional views illustrating the manufacturing process in accordance with the present invention, there will be described a first embodiment in which the third aspect of the present invention is applied to manufacturing of an N-channel MOS transistor.

Figure 8A:
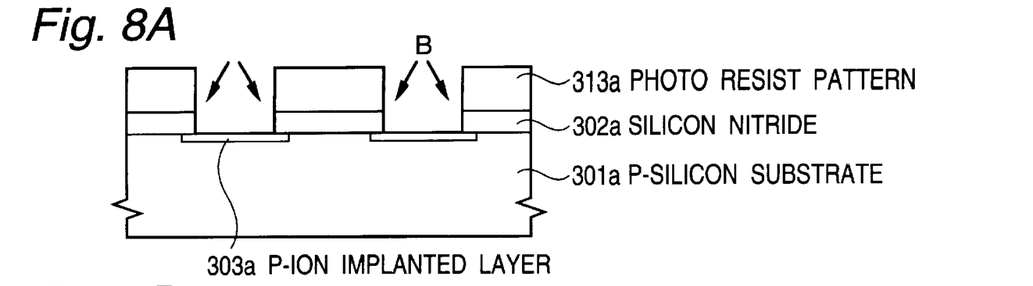

First, similarly to the first embodiment of the first aspect of the present invention, on a surface of a P-type silicon substrate 301a having the impurity concentration of for example $1 \times 10^{17}$ cm$^{-3}$ to $1 \times 10^{18}$ cm$^{-3}$, a silicon nitride film, which is an oxidation resistive film, having a thickness of 50 nm to 300 nm is deposited on the LPCVD process. Prior to deposition of this silicon nitride film, a pad oxide film may be deposited on the surface of the P-type silicon substrate 301a by thermal oxidation. This silicon nitride film is patterned using a photo resist film pattern 313a as a mask, so that a silicon nitride film 302a remains to cover a device formation region of the surface of the P-type silicon substrate 301a. Succeedingly, by using the photo resist film pattern 313a and the patterned silicon nitride film 302a as a mask, similarly to the third embodiment of the first aspect of the present invention, a rotary oblique ion implantation of a P-type impurity such as boron is carried to form a P-type ion-implanted layer 303a having the impurity concentration of $1 \times 10^{18}$ cm$^{-3}$ to $1 \times 10^{19}$ cm$^{-3}$ at the surface of the P-type silicon substrate 301a (FIG. 8A).

Figure 8B:
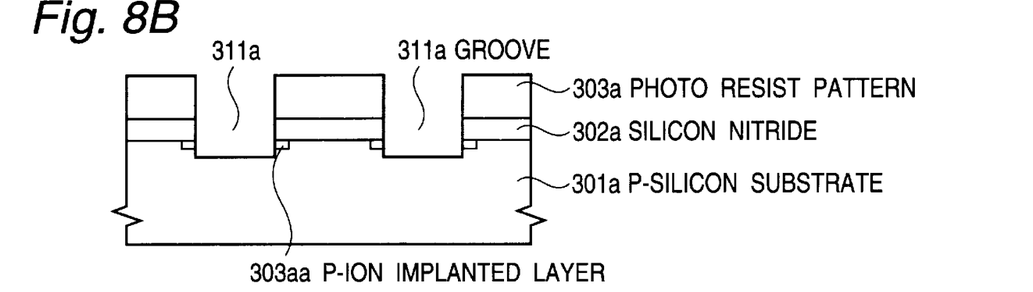

Succeedingly, an anisotropic etching is carried out using the photo resist film pattern 313a as a mask, so that a groove 311a having the depth of about 10 nm to 100 nm is formed at the surface of the P-type silicon substrate 301a and the P-type ion-implanted layer 303a is divided into P-type ion-implanted layers 303aa (FIG. 8B).

After the photo resist pattern 313a is removed, similar to the first embodiment of the first aspect of the present invention, a selective oxidation is carried out at a temperature of 950° C. to 1100° C., so that a field oxide film 305a having the thickness of 100 nm to 500 nm is formed in the groove 311a, and simultaneously, the P-type ion-implanted layers 303aa are activated to form a P-type impurity concentration adjusting regions 304a which are positioned at the surface of the P-type silicon substrate 301a adjacent to the edge of the field oxide film 305a, and which has the impurity concentration of $1\times10^{17}$ cm$^{-3}$ to $1\times10^{18}$ cm$^{-3}$. The impurity concentration of the P-type impurity concentration adjusting region 304a lowers to about 1/10 of the impurity concentration of the P-type ion-implanted layer 303aa because of segregation caused in the thermal oxidation for forming the field oxide film 305a (FIG. 8C).

Figure 8D:
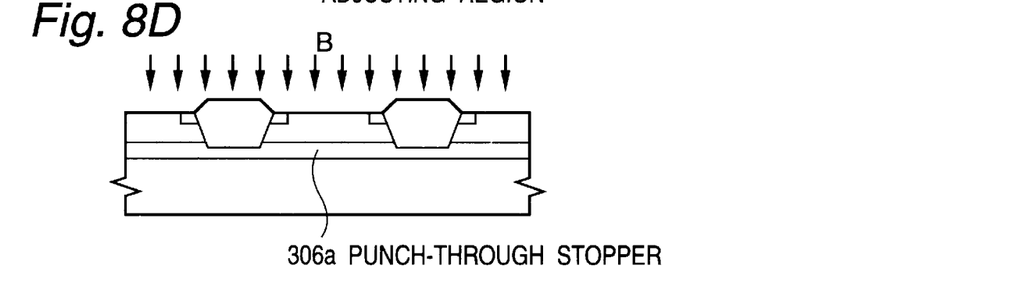

After the silicon nitride film 302a is removed, similar to the first embodiment of the first aspect of the present invention, a P-type impurity such as boron (B) is ion-implanted onto the whole surface to form a second P-type ion implanted layer (not shown) in the P-type silicon substrate 301a. The condition for this ion implantation is set to the effect that the concentration peak of the second P-type ion-implanted layer is positioned near to a planar portion of the bottom of the field oxide film 305a. Furthermore, a heat treatment is carried out to activate the second P-type ion implanted layer, so that a P-type punch-through stopper layer 306a having the impurity concentration of $1\times10^{18}$ cm$^{-3}$ to $1\times10^{19}$ cm$^{-3}$ is formed in the P-type silicon substrate 301a. This P-type punch-through stopper layer 306a is positioned at a level deeper than with a bottom of source/drain regions formed of an N$^+$ diffused layer which will be formed in a later step, but is in contact with at least the planar portion of the bottom of the field oxide film 305a (FIG. 8D).

Figure 8E:
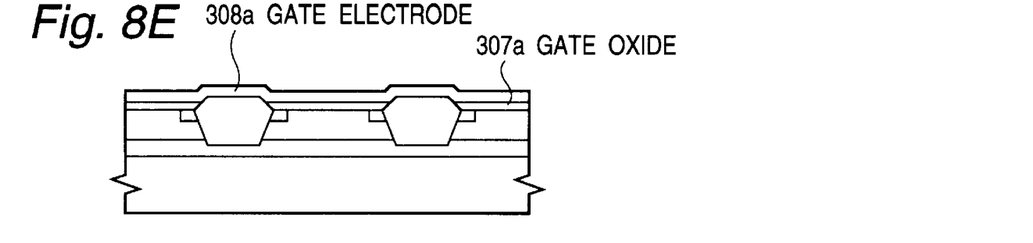

Thereafter, a gate oxide film 307a is formed on the device formation region of the surface of the P-type silicon substrate 301a by the thermal oxidation, and then, a gate electrode 308a and source/drain regions (not shown) constituted of an N$^+$ diffused layer are formed, so that an N-channel MOS transistor in accordance with this embodiment is formed (FIG. 8E).

The above mentioned first embodiment of the third aspect of the present invention has the same advantage as that of the embodiment of the second aspect of the present invention. Furthermore, the above mentioned embodiment of the third aspect of the present invention can make the distance between the P-type impurity concentration adjusting region 304a and the P-type punch-through stopper layer 306a, larger than (the distance between the P-type impurity concentration adjusting region 204 and the P-type punch-through stopper layer 206 in) the embodiment of the second aspect of the present invention. Therefore, as regards the junction leakage between the source/drain region and the punch-through stopper layer, the above mentioned first embodiment of the third aspect of the present invention is more excellent than the embodiment of the second aspect of the present invention.

Referring to FIGS. 9A to 9E which are diagrammatic sectional views illustrating the manufacturing process in accordance with the present invention, there will be described a second embodiment in which the third aspect of the present invention is applied to manufacturing of a P-channel MOS transistor.

Figure 9A:
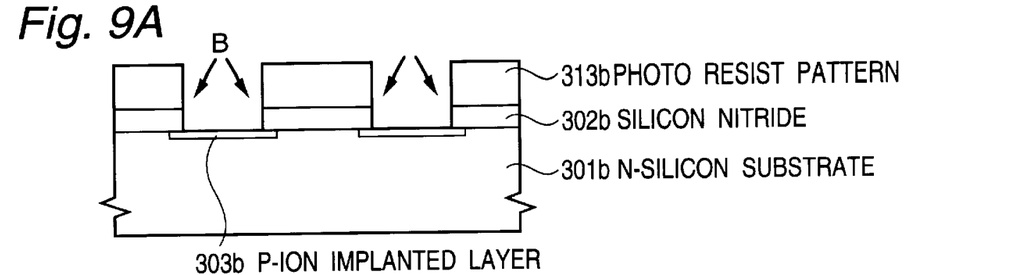

First, on a surface of an N-type silicon substrate 301b having the impurity concentration of for example $1\times10^{17}$ cm$^{-3}$ to $1\times10^{18}$ cm$^{-3}$, a silicon nitride film, which is an oxidation resistive film, having a thickness of 50 nm to 300 nm is deposited on the LPCVD process. Prior to deposition of this silicon nitride film, a pad oxide film may be deposited on the surface of the N-type silicon substrate 301b by a thermal oxidation. This silicon nitride film is patterned using a photo resist film pattern 313b as a mask, so that a silicon nitride film 302b remains to cover a device formation region of the surface of the N-type silicon substrate 301b. Succeedingly, by using the photo resist film pattern 313b and the patterned silicon nitride film 302b as a mask, a rotary oblique ion implantation of a P-type impurity such as boron is carried to form a P-type ion-implanted layer 303b having the impurity concentration of $1\times10^{18}$ cm$^{-3}$ to $1\times10^{19}$ cm$^{-3}$ at the surface of the N-type silicon substrate 301b (FIG. 9A).

Figure 9B:
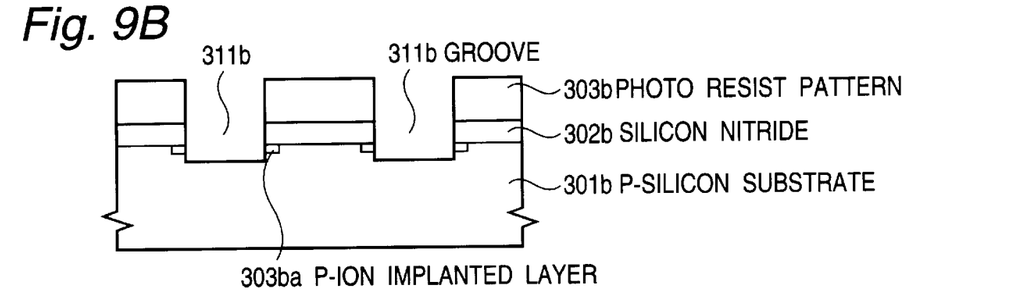

Succeedingly, an anisotropic etching is carried out using the photo resist film pattern 313b as a mask, so that a groove 311b having the depth of about 10 nm to 100 nm is formed at the surface of the N-type silicon substrate 301b and the P-type ion-implanted layer 303b is divided into P-type ion-implanted layers 303ba (FIG. 9B).

After the photo resist pattern 313a is removed, a selective oxidation is carried out at a temperature of 950° C. to 1100° C., so that a field oxide film 305b having the thickness of 100 nm to 500 nm is formed in the groove 311b, and simultaneously, the P-type ion-implanted layers 303ba are activated to form an N-type impurity concentration adjusting regions 304b which are positioned at the surface of the N-type silicon substrate 301b adjacent to the edge of the field oxide film 305b, and which has the impurity concentration of $1\times10^{17}$ cm$^{-3}$ to $1\times10^{18}$ cm$^{-3}$ (equal to the impurity concentration of the N-type silicon substrate 301b). The formation of the impurity concentration adjusting region 304b is attributable to the fact that the elevation of the N-type impurity concentration caused by segregation (pile-up) of the N-type impurity at the device isolation region edge at the time of forming the field oxide film 305b is canceled by the P-type impurity included in the P-type ion-implanted layers 303ba (FIG. 9C).

Figure 9D:
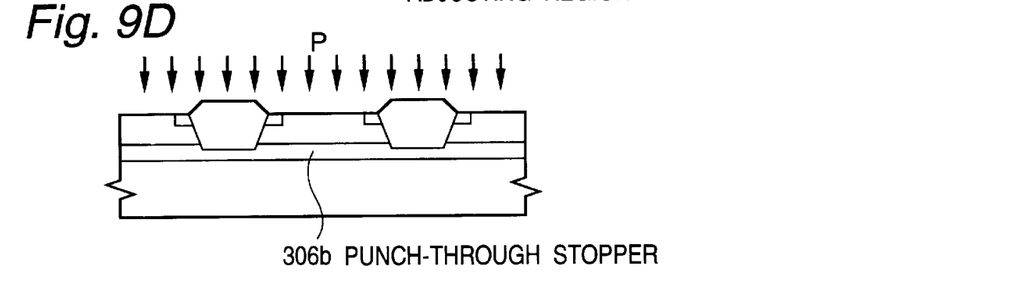

After the silicon nitride film 302b is removed, an N-type impurity such as phosphorus (P) is ion-implanted onto the whole surface to form an N-type ion implanted layer (not shown) in the N-type silicon substrate 301b. The condition for this ion implantation is set to the effect that the concentration peak of the N-type ion-implanted layer is positioned near to a planar portion of the bottom of the field oxide film 305b. Furthermore, a heat treatment is carried out to activate the N-type ion implanted layer, so that an N-type punch-through stopper layer 306b having the impurity concentration of $1\times10^{18}$ cm$^{-3}$ to $1\times10^{19}$ cm$^{-3}$ is formed in the N-type silicon substrate 301b. This P-type punch-through stopper layer 306b is positioned at a level deeper than with a bottom of source/drain regions formed of a P$^+$ diffused layer which will be formed in a later step, but is in contact with at least the planar portion of the bottom of the field oxide film 305b (FIG. 9D).

Figure 9E:
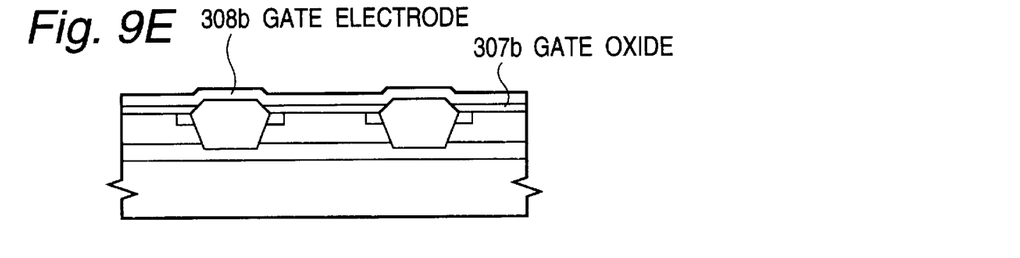

Thereafter, a gate oxide film 307b is formed on the device formation region of the surface of the N-type silicon substrate 301b by the thermal oxidation, and then, a gate electrode 308b and source/drain regions (not shown) constituted of a P$^+$ diffused layer are formed, so that a P-channel MOS transistor in accordance with this second embodiment is formed (FIG. 9E).

The above mentioned second embodiment of the third aspect of the present invention has the same advantage as that obtained when the second aspect of the present invention is applied to the P-channel MOS transistor. In the above mentioned second embodiment of the third aspect of the present invention, the P-channel MOS transistor is formed at the surface of the N-type silicon substrate, but the third aspect of the present invention is in no way limited to this embodiment, and can be applied to the case in which a P-channel MOS transistor is formed in an N-well.

As seen from the above, according to the semiconductor device manufacturing method in accordance with the present invention, after patterning the oxidation resistive film covering the silicon substrate of one conductivity type, the P-type impurity is ion-implanted before forming the field oxide film by the selective oxidation, so that the one conductivity type impurity concentration adjusting region is formed at the silicon substrate surface adjacent to the edge of the device isolation region after the formation of the field oxide film. With this construction, the narrow channel effect and the reverse narrow channel effect are effectively and stably suppressed in the N-channel MOS transistor, and the narrow channel effect is effectively and stably suppressed in the P-channel MOS transistor, so that a fine device isolation can be easily realized in these MOS transistors.

I claim:

1. A semiconductor device manufacturing method comprising:

the step of forming at least an oxidation resistive film on a surface of a silicon substrate of a first conductivity type, forming a photo resist film pattern on said oxidation resistive film in a device formation region of the surface of said silicon substrate, and patterning at least said oxidation resistive film using said photo resist film pattern as a mask;

the step of ion-implanting a P-type impurity under a predetermined condition, using said photo resist film pattern as a mask, to form a P-type ion-implanted layer at the surface of said silicon substrate;

the step of removing said photo resist film pattern;

the step of forming a field oxide film at the surface of said silicon substrate through the P-type ion-implanted layer by a selective oxidation using said oxidation resistive film as a mask to separate the P-type ion-implanted layer into spaced apart first conductivity type impurity concentration adjusting regions only at ends of said device formation region adjacent to said field oxide film; and the step of removing said oxidation resistive film, and ion-implanting an impurity of said first conductivity type in contact with at least a planar portion of a bottom of said field oxide film.

2. A semiconductor device manufacturing method claimed in claim 1 wherein after said photo resist film is removed, said P-type ion-implanted layer is activated by a heat treatment.

3. A semiconductor device manufacturing method claimed in claim 1 wherein said ion implantation of said P-type impurity is carried out by a rotary oblique ion implantation.

4. A semiconductor device manufacturing method comprising:

the step of forming at least an oxidation resistive film on a surface of a silicon substrate of a first conductivity type, forming a photo resist film pattern on said oxidation resistive film in a device formation region of the surface of said silicon substrate, patterning at least said oxidation resistive film using said photo resist film pattern as a mask, and forming a groove at the surface of said silicon substrate using said photo resist film pattern as a mask;

the step of carrying out a rotary oblique ion implantation of a P-type impurity under a predetermined condition, using at least said photo resist film pattern as a mask, to form a P-type ion-implanted layer in a surface of said groove;

the step of removing said photo resist film pattern;

the step of forming a field oxide film at the surface of said silicon substrate through the P-type ion-implanted layer by a selective oxidation using said oxidation resistive film as a mask to separate the P-type ion-implanted layer into spaced apart first conductivity type impurity concentration adjusting regions only at ends of said device formation region adjacent to said field oxide film; and the step of removing said oxidation resistive film, and ion-implanting an impurity of said first conductivity type in contact with at least a planar portion of a bottom of said field oxide film.

5. A semiconductor device manufacturing method claimed in claim 4 wherein after said photo resist film is removed, said P-type ion-implanted layer is activated by a heat treatment.

6. A semiconductor device manufacturing method comprising:

the step of forming at least an oxidation resistive film on a surface of a silicon substrate of a first conductivity type, forming a photo resist film pattern on said oxidation resistive film in a device formation region of the surface of said silicon substrate, and patterning at least said oxidation resistive film using said photo resist film pattern as a mask;

the step of carrying out a rotary oblique ion implantation of a P-type impurity under a predetermined condition, using at least said photo resist film pattern as a mask, to form a P-type ion-implanted layer at the surface of said silicon substrate;

the step of forming at the surface of said silicon substrate a groove having a predetermined depth penetrating through said P-type ion-implanted layer, by an etching using at least said photo resist film pattern as a mask;

the step of removing said photo resist film pattern;

the step of forming a field oxide film at the surface of said silicon substrate by a selective oxidation using said oxidation resistive film as a mask and forming a first conductivity type impurity concentration adjusting region at an end of said device formation region adjacent to said field oxide film; and the step of removing said oxidation resistive film, and ion-implanting an impurity of said first conductivity type under a predetermined condition, to form in said silicon substrate a punch-through stopper layer of said first conductivity type in contact with at least a planar portion of a bottom of said field oxide film.

7. The method of claim 1, further comprising the step of forming at the surface of said silicon substrate a groove having a predetermined depth penetrating through said P-type ion-implanted layer, by an etching using at least said photo resist film pattern as a mask after the step of ion-implanting to form the P-type ion-implanted layer.

* * * * *